(12) United States Patent
Pathak

(10) Patent No.: US 11,221,378 B2
(45) Date of Patent: Jan. 11, 2022

(54) SYSTEMS, METHODS, AND PROGRAM PRODUCTS FOR TESTING ELECTRICAL LOOPS INCLUDED IN CONTROL CIRCUITS OF ELECTRICAL POWER SYSTEMS

(71) Applicant: General Electric Company, Schenectady, NY (US)

(72) Inventor: Sudeep Pathak, Hyderabad (IN)

(73) Assignee: General Electric Company, Schenectady, NY (US)

( * ) Notice: Subject to any disclaimer, the term of this patent is extended or adjusted under 35 U.S.C. 154(b) by 185 days.

(21) Appl. No.: 16/782,572

(22) Filed: Feb. 5, 2020

(65) Prior Publication Data

US 2021/0239771 A1 Aug. 5, 2021

(51) Int. Cl.
| | | |
|---|---|---|
| *G01R 31/54* | (2020.01) | |
| *H02J 13/00* | (2006.01) | |
| *G05B 19/04* | (2006.01) | |
| *G05B 19/042* | (2006.01) | |
| *G01R 31/327* | (2006.01) | |
| *H02J 3/00* | (2006.01) | |

(52) U.S. Cl.
CPC ......... *G01R 31/54* (2020.01); *G01R 31/3278* (2013.01); *G05B 19/0428* (2013.01);
(Continued)

(58) Field of Classification Search
None
See application file for complete search history.

(56) References Cited

U.S. PATENT DOCUMENTS

| | | | | |
|---|---|---|---|---|
| 3,891,838 A | * | 6/1975 | Herr | H04Q 3/54591 |
| | | | | 714/46 |
| 4,000,460 A | * | 12/1976 | Kadakia | G06F 11/273 |
| | | | | 714/726 |

(Continued)

FOREIGN PATENT DOCUMENTS

| | | | | | |
|---|---|---|---|---|---|
| CN | 102084568 B | * | 3/2015 | | H02H 3/06 |
| CN | 105223941 A | * | 1/2016 | | G05B 23/02 |
| CN | 105425144 A | * | 3/2016 | | G01R 31/327 |

OTHER PUBLICATIONS

Deng et al., "Fault location in loop distribution network using SVM technology", Aug. 13, 2013, Electrical Power and Energy Systems 65 (2015) 254-261. (Year: 2013).*

(Continued)

*Primary Examiner* — Mohammad Ali
*Assistant Examiner* — Kelvin Booker
(74) *Attorney, Agent, or Firm* — James Pemrick; Hoffman Warnick LLC

(57) ABSTRACT

Power systems are disclosed. The power system may include at least one computing device in communication with a control circuit including a plurality of electrical loops. The computing device(s) may be configured to test each of the plurality of electrical loops of the control circuit by performing processes including configuring a first electrical loop in a first electrical setting by adjusting an operational characteristic of one or more electrical switch(es) of the first electrical loop. The processes may also include determining an actual electrical status of the first electrical loop in the first electrical setting based on whether a relay of a return line in the first electrical loop detects a supplied voltage. Additionally, the computing device(s) may detect a fault in the first electrical loop in response to the determined actual electrical status of the first electrical loop differing from an expected electrical status of the first electrical loop.

20 Claims, 7 Drawing Sheets

(52) U.S. Cl.
CPC ........ *H02J 3/001* (2020.01); *H02J 13/00002* (2020.01); *H02J 13/00036* (2020.01); *G05B 2219/31356* (2013.01)

(56) References Cited

U.S. PATENT DOCUMENTS

| | | | |
|---|---|---|---|
| 4,002,847 A * | 1/1977 | Dail | H04B 1/74 370/224 |
| 5,993,039 A | 11/1999 | Crill | |
| 6,215,855 B1 * | 4/2001 | Schneider | H04B 3/46 324/527 |
| 6,816,758 B2 | 11/2004 | Maxwell, Jr. et al. | |
| 6,907,321 B2 | 6/2005 | Kearney et al. | |
| 7,079,555 B2 * | 7/2006 | Baydar | H04J 3/1611 370/532 |
| 7,418,314 B2 | 8/2008 | Rasmussen et al. | |
| 7,860,615 B2 | 12/2010 | Nelson et al. | |
| 8,301,312 B2 | 10/2012 | Saikkonen et al. | |
| 8,670,872 B2 | 3/2014 | Rasmussen et al. | |
| 8,718,830 B2 | 5/2014 | Smith | |
| 8,718,833 B2 | 5/2014 | McMullin | |
| 2014/0254050 A1 * | 9/2014 | Haines | H02H 3/16 361/42 |
| 2014/0358308 A1 | 12/2014 | Steckley et al. | |
| 2018/0061598 A1 * | 3/2018 | Festl | H01F 38/28 |

OTHER PUBLICATIONS

Liu et al., "Hardware-in-the-loop Relay Testing in Dominion's Blackstart Plan", 2017 IEEE. (Year: 2017).*

* cited by examiner

SYSTEMS, METHODS, AND PROGRAM PRODUCTS FOR TESTING ELECTRICAL LOOPS INCLUDED IN CONTROL CIRCUITS OF ELECTRICAL POWER SYSTEMS

BACKGROUND

The disclosure relates generally to power systems, and more particularly, to systems, methods, and program products for testing electrical loops included in control circuits of electrical power systems.

In electric power systems, electrical switching devices or components are typically used when one or more sources of electrical power is shared or connected between multiple electrical power loads. These electrical switching devices provide an electrical path for the electrical power to flow from a source of the electrical power to the electrical power loads, and ensure that the electrical power gets routed to a desired electrical power load of the electric power system. As the electrical power circuit or network for the electric power system expands or grows, the desired or proper operation of these electrical switching devices becomes crucial. For an electric power system where the power sources are not electrical synced (e.g., phase shifted sources), it is imperative to make arrangements to inhibit paralleling of the power sources to prevent failure within the system. It is also desired to maintain power source-level redundancy so that loss of one power source within the electric power system does not affect the operation of the entire system.

For complex electrical networks forming the electric power systems, a plurality of electrical switching devices may be utilized to prevent faults within the electric power system from affecting the desired operation of the system. The electrical switching devices are often wired and/or implemented into the system as needed (e.g., network growth) by operators of the system. However, due to human error and/or the complexity of the network, the electrical switching devices may not be implemented correctly or even at all within the electric power system. In instances where the electrical switch devices are improperly installed (or not installed at all), the electric power system may fail. To test electrical switching devices in the electrical network, an operator must physically interact and/or inspect the electrical network. Testing each junction or portion of the electrical network that includes these electrical switching devices is time consuming, expensive, and/or sometimes dangerous to the testing operator. As such, the electrical networks forming the electric power systems are often not tested or inspected until a fault in the system is experienced.

SUMMARY

A first aspect of the disclosure provides a power system, including: at least one computing device in communication with a control circuit including a plurality of electrical loops, each electrical loop of the plurality of electrical loops including: a phase line, a return line operably connected to the phase line, the return line including a relay, and at least one electrical switch operably coupled between the phase line and the return line, wherein the at least one computing device is configured to test each of the plurality of electrical loops of the control circuit by performing processes including: configuring a first electrical loop of the plurality of electrical loops in a first electrical setting by adjusting an operational characteristic of the at least one electrical switch; supplying a voltage across the first electrical loop in the first electrical setting via the phase line; determining an actual electrical status of the first electrical loop in the first electrical setting based on whether the relay of the return line detects the supplied voltage; and detecting a fault in the first electrical loop in response to the determined actual electrical status of the first electrical loop in the first electrical setting differing from an expected electrical status of the first electrical loop in the first electrical setting.

A second aspect of the disclosure provides a method of testing a plurality of electrical loops included in a control circuit. The method includes: configuring a first electrical loop of the plurality of electrical loops in a first electrical setting by adjusting an operational characteristic of at least one electrical switch of the first electrical loop, wherein each electrical loop of the plurality of electrical loops includes: a phase line, a return line operably connected to the phase line, the return line including a relay, and the at least one electrical switch operably coupled between the phase line and the return line; supplying a voltage across the first electrical loop in the first electrical setting via the phase line; determining an actual electrical status of the first electrical loop in the first electrical setting based on whether the relay of the return line detects the supplied voltage; and detecting a fault in the first electrical loop in response to the determined actual electrical status of the first electrical loop in the first electrical setting differing from an expected electrical status of the first electrical loop in the first electrical setting.

A third aspect of the disclosure provides a computer program product including program code, which when executed by at least one computing device, causes the at least one computing device to test a plurality of electrical loops of a control circuit, by performing processes including: configuring a first electrical loop of the plurality of electrical loops in a first electrical setting by adjusting an operational characteristic of at least one electrical switch of the first electrical loop, wherein each electrical loop of the plurality of electrical loops includes: a phase line, a return line operably connected to the phase line, the return line including a relay, and the at least one electrical switch operably coupled between the phase line and the return line; supplying a voltage across the first electrical loop in the first electrical setting via the phase line; determining an actual electrical status of the first electrical loop in the first electrical setting based on whether the relay of the return line detects the supplied voltage; and detecting a fault in the first electrical loop in response to the determined actual electrical status of the first electrical loop in the first electrical setting differing from an expected electrical status of the first electrical loop in the first electrical setting.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

As an initial matter, in order to clearly describe the current disclosure it will become necessary to select certain terminology when referring to and describing relevant machine components within a gas turbine system and/or combined cycle power plants. When doing this, if possible, common industry terminology will be used and employed in a manner consistent with its accepted meaning. Unless otherwise stated, such terminology should be given a broad interpretation consistent with the context of the present application and the scope of the appended claims. Those of ordinary skill in the art will appreciate that often a particular component may be referred to using several different or overlapping terms. What may be described herein as being a single part may include and be referenced in another context as consisting of multiple components. Alternatively, what may be described herein as including multiple components may be referred to elsewhere as a single part.

As indicated above, the disclosure relates generally to power systems, and more particularly, to systems, methods, and program products for testing electrical loops included in control circuits of electrical power systems.

These and other embodiments are discussed below with reference to FIGS. 1-7. However, those skilled in the art will readily appreciate that the detailed description given herein with respect to these figures is for explanatory purposes only and should not be construed as limiting.

Figure 1:
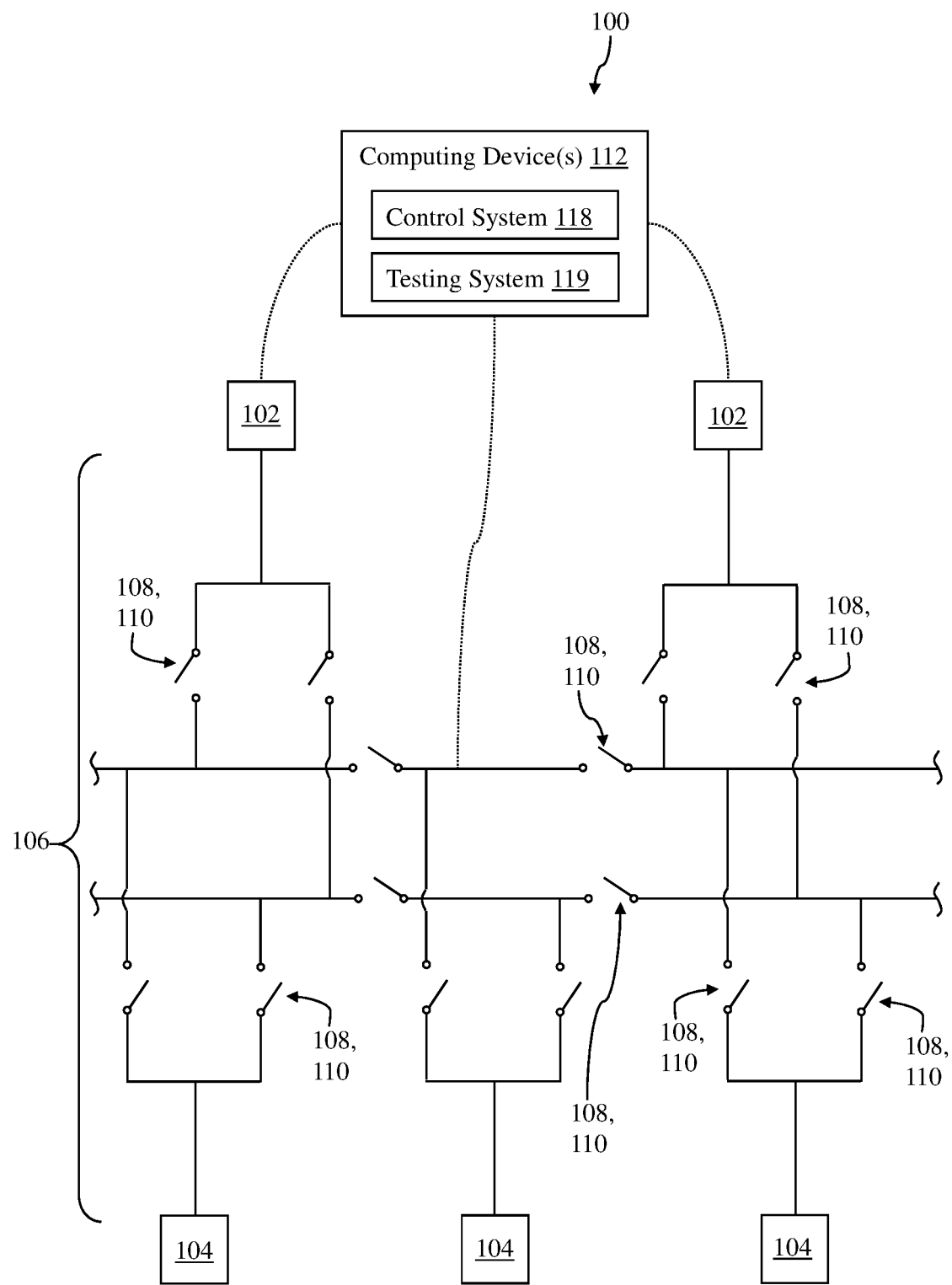
FIG. 1 shows a schematic depiction of a power system including power sources, electrical loads, a power circuit including electrical hardware components, and at least one computing device, according to embodiments of the disclosure.

FIG. 1 shows a schematic view of an electrical power system 100. Electrical power system 100 may be any suitable system and/or configuration that may include components/devices for generating and/or utilizing power. For example, electrical power system 100 may include at least one power source 102 and at least one electrical load 104 operably coupled to power source(s) 102. Power source(s) 102 may be formed as any suitable device, apparatus, or system that may generate power and/or a load, for example, a gas turbine system. Additionally, electrical load(s) 104 of system 100 may include any suitable device, apparatus, and/or system that may require and/or utilize the power generated by power source(s) 102, for example, an electrical grid, a residential neighborhood, or a commercial building. In the non-limiting example, electrical power system 100 may include two power sources 102 and three electrical loads 104. However, it is understood that system 100 may include more or less power sources and/or electrical loads than depicted, and the number of power sources and/or electrical loads shown in FIG. 1 is merely illustrative.

Electrical load(s) 104 may be operably coupled to power source(s) 102 via a power circuit 106. More specifically, and as shown in FIG. 1, power circuit 106 may electrically couple and may be positioned or formed between power source(s) 102 and electrical load(s) 104 of system 100. Power circuit 106 may include any suitable devices and/or systems that may electrically couple power source(s) 102 and electrical load(s) 104. For example, and as shown in the schematic view of system 100 in FIG. 1, power circuit 106 may include a plurality of electrical lines, wires, and/or interconnects to operably couple power source(s) 102 and electrical load(s) 104 and/or put electrical load(s) 104 in electronic/electrical communication with power source(s) 102. To aid in providing electrical load(s) 104 with power from power source(s) 102, power circuit 106 may include at least one electrical hardware component 108 (hereafter, "hardware components 108"). Hardware component 108 may be positioned in and/or on power circuit 106, and may selectively, electrically couple power source(s) 102 and electrical load(s) 104. That is, hardware components 108 may operate to form connections or interconnects within power circuit 106 to allow at least one designated power source 102 to supply power to at least one designated electrical load 104. Additionally, hardware components 108 may function or operate together to ensure that multiple power sources 102 are not supplying power to a single electrical load 104, and to ensure all load demands by electrical load 104 are met when, for example, one of the one or more power sources 102 is unable to provide power to electrical load(s) 104. As discussed herein, the operation and/or function of the plurality of hardware components 108 is controlled and/or ensured, in part, by the control circuits 110 found or included in each hardware component 108. That is, each of the hardware components 108 of power circuit 106 may include control circuit(s) 110. Hardware components 108, as shown in FIG. 1, may be formed as any suitable component capable of selectively, electrically coupling power source(s) 102 and electrical load(s) 104 within power system 100.

As shown in FIG. 1, power system 100 may also include at least one computing device 112. Computing device(s) 112 may be configured to control the operation of electrical power system 100, and/or run tests on the various components of system 100, as discussed herein. Computing device(s) 112 may be hard-wired and/or wirelessly connected to and/or in communication with power system 100, and its various components (e.g., power source(s) 102, electrical load(s) 104, power circuit 106, hardware components 108, and so on) via any suitable electronic and/or mechanical communication component or technique. Computing device(s) 112, and its various components discussed herein, may be a single stand-alone system that functions separately from another system or device (e.g., computing device not shown) that may control and/or adjust operations and/or functions of power system 100, and its various components. Alternatively, computing device(s) 112 and its components may be integrally formed within, in communication with and/or formed as a part of a larger or single control system (e.g., computing device not shown) that may control and/or adjust operations and/or functions of power system 100, and its various components.

In the non-limiting example, computing device(s) 112 may include a control system 118 for controlling operations of power system 100. Control system 118 may control power system 100 and its various components, to ensure that load demands from electrical load(s) 104 are met by power source(s) 102. Additionally, computing device(s) 112 may include a testing system 119. As discussed herein, testing system 119 may conduct or run tests in power system 100, and more specifically on control circuits 110 included in hardware components 108 of electrical circuit 106, to ensure power system 100 is operating correctly and/or efficiently. In the non-limiting example shown in FIG. 1, control system 118 and testing system 119 are depicted as two distinct systems within computing device(s) 112. It is to be understood that control system 118 and testing system 119 may also be a single system and/or component of computing device(s) 112 that may be capable of controlling operations of power system 100, as well as conducting tests on control circuits 110 included in hardware components 108 of power circuit 106, as discussed herein.

Figure 2:
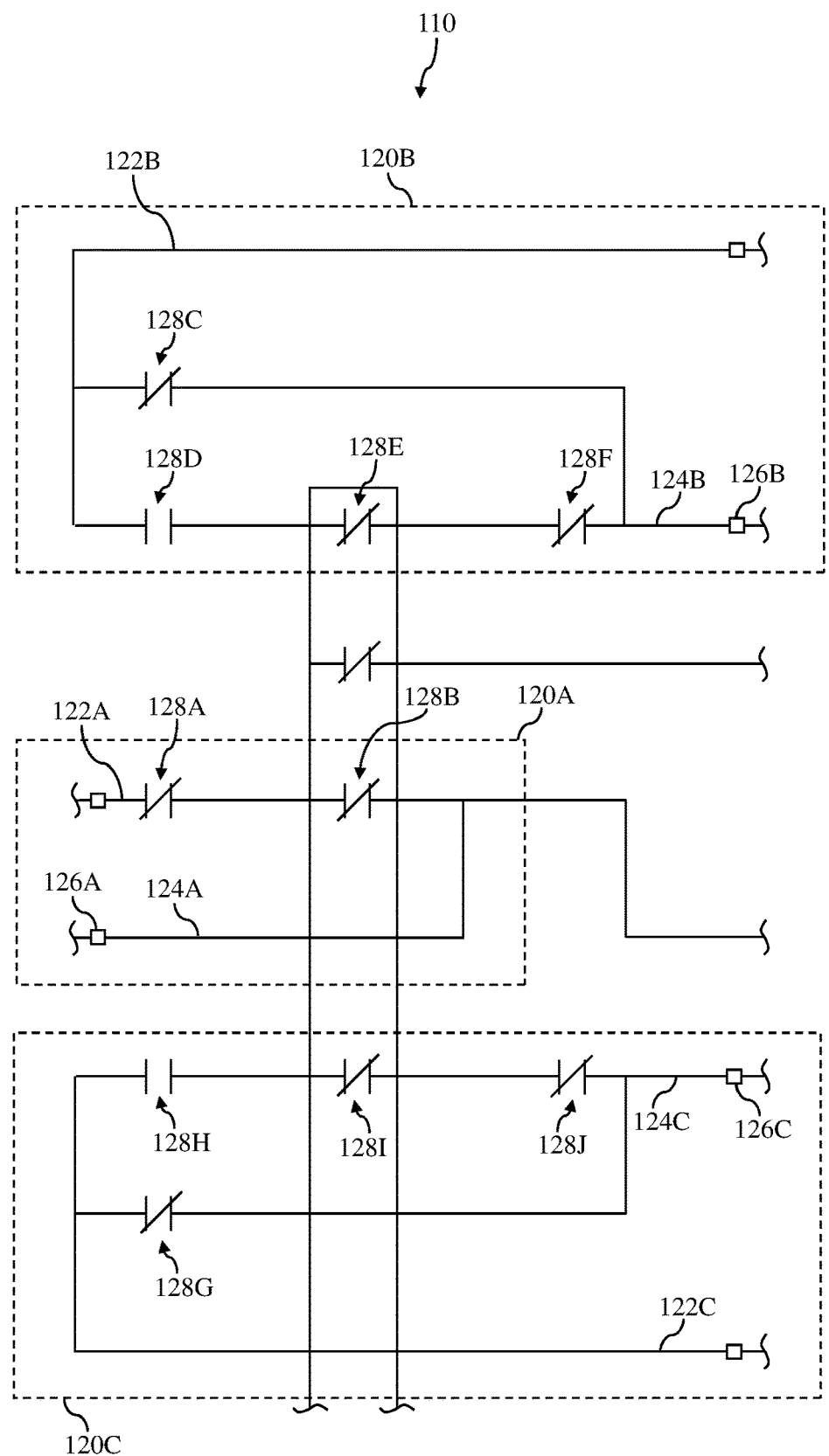
FIG. 2 shows a schematic depiction of a portion of a control circuit included in the electrical hardware components, according to embodiments of the disclosure.

FIG. 2 shows a schematic view of a portion of control circuit 110 of one of a plurality of electrical hardware components 108. More specifically, FIG. 2 shows an enlarged schematic view of a portion of control circuit 110 included within and configured to operate hardware components 108 of power circuit 106 for power system 100. The portion of control circuit 110 may be illustrative, and/or may not depict the entirety of control circuit 110 configured to aid in the operation of hardware components 108 and/or the selective, electrical coupling between power source(s) 102 and electrical load(s) 104 via hardware components 108 (see, FIG. 1), as discussed herein. Additionally, the non-limiting example portion of control circuit 110 shown in FIG. 2 may represent the actual or physical circuitry and/or configuration for control circuit 110 of one of the plurality of hardware components 108 of power system 100.

As shown in FIG. 2, control circuit 110 may include a plurality of electrical loops 120. That is, control circuit 110 may be formed and/or configured as a plurality of electrical loops 120, which may be electrically coupled to one another and/or may be electrically and/or mechanically coupled to a power source or power line of the circuit. The portion of control circuit 110 may include three identified and distinct electrical loops 120A, 120B, 120C. However, it is to be understood that the totality of control circuit 110 may include more electrical loops than the three shown in the non-limiting example of FIG. 2. In other non-limiting examples, control circuit may include less or more than three electrical loops in total.

Each electrical loop 120A, 120B, 120C of control circuit 110 may include a plurality of components and/or devices. More specifically, each electrical loop 120A, 120B, 120C may include a plurality of components and/or devices formed and/or positioned on any respective electrical lines, wires, and/or electrical interconnects that may form control circuit 110. For example, each electrical loop 120A, 120B, 120C may include a respective phase line 122A, 122B, 122C and a return line 124A, 124B, 124C electrically coupled and/or operably connected to corresponding phase line 122A, 122B, 122C. Phase line 122A, 122B, 122C may be electrically coupled to and/or configured to receive, carry, and pass a voltage to return line 124A, 124B, 124C, respectively. Additionally, and as shown in FIG. 2, return line 124A, 124B, 124C may include a respective relay 126A, 126B, 126C, which may be configured to detect and/or sense a voltage passed from phase line 122A, 122B, 122C and flowing through return line 124A, 124B, 124C, respectively.

Each electrical loop 120A, 120B, 120C may also include at least one electrical switch 128. In non-limiting examples, electrical switch(es) 128 represents the physical state of the various hardware components 108 present in electrical power system 100. Electrical switch(es) 128 of electrical loop 120 may be positioned on, positioned in, and/or operably coupled between phase line 122A, 122B, 122C and return line 124A, 124B, 124C. Additionally, each electrical switch 128 included in electrical loop 120 may be positioned upstream of relay 126A, 126B, 126C of return line 124A, 124B, 124C. In the non-limiting example shown in FIG. 2, first electrical loop 120A of control circuit 110 may include two electrical switches 128A, 128B, second electrical loop 120B of control circuit 110 may include four electrical switches 128C, 128D, 128E, 128F, and third electrical loop 120A of control circuit 110 may include four electrical switches 128G, 128H, 128I, 128J. With respect to the first electrical loop 120A, electrical switches 128A, 128B may be operably coupled between phase line 122A and return line 124A in series, with first electrical switch 128A being positioned first and/or upstream of second electrical switch 128B. Second electrical loop 120B may include electrical switch 128C positioned in parallel to electrical switches 128D, 128E, 128F position (sequentially) in series, and operably coupled between phase line 122B and return line 124B. Additionally, third electrical loop 120C may include electrical switch 128G positioned in parallel to electrical switches 128H, 128I, 128J position (sequentially) in series, and operably coupled between phase line 122C and return line 124C.

Electrical switches 128 included in each electrical loop 120 of control circuit 110 may aid in and/or may be configured by testing system 119 in FIG. 1 to either allow or prevent a voltage from passing between phase line 122 and return line 124, which ultimately may control the function and/or operation of electrical hardware components 108 of power circuit 106 (see, FIG. 1) including control circuit 110 therein. As such, electrical switches 128 may be any suitable mechanical, electrical, or electronic devices and/or components that may be configured to break and/or connect portions of phase line 122 and/or return line 124 within each electrical loop 120. For example, each electrical switch 128 may include a switch having a predetermined type or position status, such as a switch having a normally closed position status or a switch having a normally open position status. In the non-limiting example of FIG. 2, electrical switches 128A, 128B, of first electrical loop 120A, electrical switches 128C, 128E, 128F of second electrical loop 120B, and electrical switches 128G, 128I, 128J of third electrical loop 120C are configured as normally closed position status switches. Additionally, electrical switch 128D of second electrical loop 120B and electrical switch 128H of third electrical loop 120C are configured as normally open positioned status switches.

The configuration of electrical switches 128 within electrical loops 120 may be dependent, at least in part, on the operation and/or function of control circuit 110. More specifically, the number of electrical switches 128 included within each electrical loop 120, the position status of each electrical switch 128 within electrical loops 120, and/or the physical location of each electrical switch 128 within electrical loops 120 may be dependent and/or based on the known operation and/or function of control circuit 110 within power system 100. As such, it is understood that the number, position status, and/or physical location of each electrical switch 128 within electrical loops 120 as shown in FIG. 2 is illustrative. As such, control circuit 110 may include more or less electrical switches, different position statuses for electrical switches, and/or electrical switches formed in different locations within control circuit 110, than those discussed herein with respect to the non-limiting example of FIG. 2.

Figure 3A:
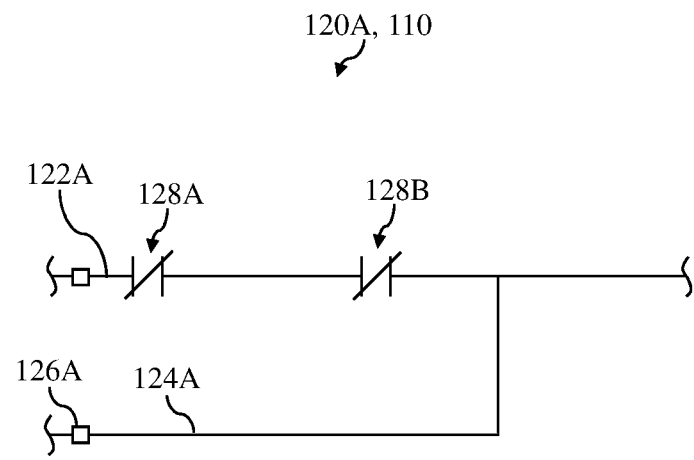
FIG. 3A shows a schematic depiction of an actual first electrical loop of the portion of control circuit shown in FIG. 2, according to embodiments of the disclosure.
Figure 3B:
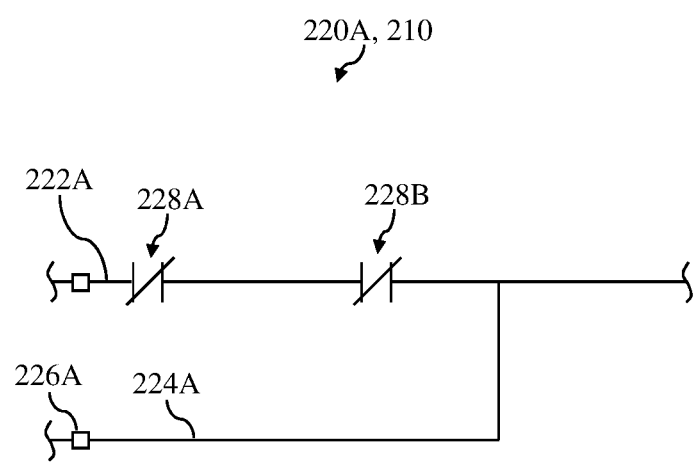
FIG. 3B shows a predetermined schematic model of the first electrical loop of the portion of control circuit shown in FIG. 2, according to embodiments of the disclosure.

Turning to FIGS. 3A and 3B, various schematic views of first electrical loop 120A (e.g., FIG. 3A), 220A (e.g., FIG. 3B) of the plurality of electrical loops in control circuit 110 (e.g., FIG. 3A), 210 (e.g., FIG. 3B) are shown. For example, FIG. 3A shows a schematic view of the actual first electrical loop 120A as formed in control circuit 110 shown in FIG. 2, while FIG. 3B shows a known or predetermined schematic model of a first electrical loop 220A for a predetermined and/or desired schematic model of control circuit 210. As discussed herein, known or predetermined schematic model of electrical loop 220A/control circuit 210 shown in FIG. 3B may represent the desire configuration or wiring of the control circuits 110 included in power system 100. It is to be understood that similarly numbered and/or named components may function in a substantially similar fashion. Redundant explanation of these components has been omitted for clarity.

As discussed herein, the actual or physical schematic of control circuit 110, as shown in FIG. 2, is based on a predetermined and/or known schematic or configuration of control circuit 110 of power system 100. That is, computing device(s) 112 (see, FIG. 1) may include a plurality of known or predetermined schematic models of all control circuits 110 included in hardware components 108 of power system 100. Each known or predetermined schematic model may represent the desire configuration or wiring of control circuits 110 included in power system 100, and the known configuration may be based on the desired and/or intended operation of each control circuit 110. In a non-limiting example, model of first electrical loop 220A shown in FIG. 3B may be included in or accessibly by computing device 112 of power system 100. Utilizing the known or predetermined schematic models, may allow computing device(s) 112 the ability to identify or know the number or quantity of electrical switches 228 that should be included in each electrical loop 220 of control circuit 210, a desired position status (e.g., normally open or normally closed) of each electrical switch 228 included in each electrical loop 220 of control circuit 210, and a desired, physical location of each electrical switch 228 included in each electrical loop 220 of control circuit 210.

Using the known or predetermined schematic models of control circuit 110, each electrical loop 120 of control circuit 110 may be tested by computing device(s) 112 of power system 100 (see, FIG. 1). That is, computing device(s) 112 may test each of the physical and/or actual electrical loops 120 of control circuit 110 included in power system 100, based on the predetermined and/or known models of control circuit 110 stored therein. With reference to FIGS. 3A and 3B, a process for testing first electrical loop 120, 220 of control circuit 110, 210 is discussed herein. Initially, computing device 112 may identify first electrical loop 120A of control circuit 110 included in power system 100, as shown in FIG. 3A. Next, computing device 112 may reference the known and/or predetermined control circuit 210 that may include electrical loop 220A that corresponds to first electrical loop 120A. Finally, computing device 112 may identify the number of electrical switches 228 that should be included in electrical loop 220A of control circuit 210, a desired position status (e.g., normally open or normally closed) of each electrical switch 228 included in electrical loop 220A of control circuit 210, and a desired, physical location of each electrical switch 228 included in electrical loop 220A of control circuit 210. In the non-limiting example, computing device 112 may identify and/or recognize, based on a predetermined model of electrical loop 220A, that first electrical loop 120A of control circuit 110 should include two electrical switches 128A, 128B, that both first and second electrical switches 128A, 128B are normally closed switches (e.g., position status), and that first electrical switch 128A is position in series and upstream of second electrical switch 128B. It is understood, however, that in some non-limiting examples, the position of electrical switches 128A, 128B may be changed or flipped (e.g., second electrical switch 128B upstream of first electrical switch 128A), and first electrical loop 120A may function or operate in a substantially similar matter. The importance of the position of electrical switches 128A, 128B within first electrical loop 120A may be dependent, at least in part, on the types of switches, the position status of each switch, the number of switches included in the loop, and/or similar characteristics.

Using the identified and known information from the predetermined model of control circuit 210, computing device(s) 112 may anticipate whether a voltage will be detected in various electrical settings and/or conditions of first electrical loop 120A during the testing process. With continued reference to FIGS. 3A and 3B, Table 1 provides the results of performing a test process on first electrical loop 120A (e.g., FIG. 3A) of control circuit 110 based on identified and/or know information from electrical loop 220A (see, FIG. 3B). As discussed herein, both first electrical switch 128A and second electrical switch 128B may include a known position status of "normally closed." Additionally, the desired position status for both first electrical switch 128A and second electrical switch 128B is also "normally closed" (see, FIG. 3B). Initially to test first electrical 120A, computing device(s) 112 may configure first electrical loop 120A in a first electrical setting by adjusting an operational characteristic of at least one electrical switch 128A, 128B. Adjusting the operational characteristic of electrical switch(es) 128A, 128B may include changing an operational position of first electrical switch 128A to an open or a closed position, and/or changing an operational position of second electrical switch 128B to an open or a closed position. As shown in Table 1, the first electrical setting for testing first electrical loop 120A may include adjusting both (normally closed) first electrical switch 128A and second electrical switch 128B to an "open" operational position.

TABLE 1

| FIRST ELECTRICAL LOOP 120A | | | | | |
|---|---|---|---|---|---|
| Electrical Setting | Switch 128A | Switch 128B | Electrical Status (Actual) | Electrical Status (Expected) | Fault |
| 1 | Open | Open | Voltage Detected | Voltage Detected | No |

TABLE 1-continued

FIRST ELECTRICAL LOOP 120A

| Electrical Setting | Switch 128A | Switch 128B | Electrical Status (Actual) | Electrical Status (Expected) | Fault |
|---|---|---|---|---|---|
| 2 | Open | Close | No Voltage Detected | No Voltage Detected | No |
| 3 | Close | Open | No Voltage Detected | No Voltage Detected | No |
| 4 | Close | Close | No Voltage Detected | No Voltage Detected | No |

Once configured in the first electrical setting, a voltage may be supplied across first electrical loop 120A in the first electrical setting. More specifically, computing device 112 may be configured to supply a voltage to phase line 122A of first electrical loop 120A, which in turn may pass or provide the voltage to return line 124A to be detected by relay 126A. Relay 126A on return line 124A may detect the voltage dependent on the operational position and the position status of electrical switches 128A, 128B operably coupled to phase line 122A and/or included within first electrical loop 120A. That is, once a voltage is supplied, computing device 112 may determine an actual electrical status of first electrical loop 120A in the first electrical setting based on whether relay 126A of return line 124A detects the supplied voltage. In the non-limiting example shown in Table 1, and with reference to FIGS. 3A and 3B, normally closed first electrical switch 128A and second electrical switch 128B adjusted to an open operational position may form and/or enable electrical connections in phase line 122A. As such, the voltage applied to phase line 122A of first electrical loop 120A may pass through/over first electrical switch 128A and second electrical switch 128B, and may continue to and be detected by relay 126A of return line 124A. As a result, and as shown in Table 1, the actual electrical status of first electrical loop 120A in the first electrical setting is that a voltage is detected.

Once the actual electrical status is determined, computing device 112 may detect if a fault exists in first electrical loop 120A. That is, computing device(s) 112 may detect a fault in first electrical loop 120A in respect to the determined electrical status of first electrical loop 120A in the first electrical setting differs from an expected or anticipated electrical status of first electrical loop 120A in a first electrical setting. As discussed herein, the expected or anticipated electrical status of first electrical loop 120A may be based on the known or predetermined models of electrical loop 220A of electrical loop 210. In the non-limiting example, computing device(s) 112 of power system 100 (see, FIG. 1) may not detect a fault for first electrical loop 120A in the first electrical setting because the actual electrical status matches the expected electrical status for first electrical loop 120A.

Computing device(s) 112 of power system 100 (see, FIG. 1) may continue to test first electrical loop 120A in various electrical settings as similarly discussed herein. That is, computing device(s) 112 may configure first electrical loop 120A in a second electrical setting distinct from the first electrical setting. First electrical loop 120A may be configured in the second electrical setting in a similar manner as when first electrical loop 120A is configured in the first electrical setting—e.g., by adjusting the operational characteristics of at least one of electrical switches 128A and 128B. In the second electrical setting, first electrical switch 128A may be adjusted to be in an open operational position, while second electrical switch 128B may be adjusted to be in a closed operation position. Unlike the first electrical setting, positioning normally closed second electrical switch 128B in the closed operational position may break the electrical connection in second electrical switch 128B and/or phase line 122A.

As similarly discussed herein, once configured in the first electrical setting, computing device(s) 112 may supply a voltage across first electrical loop 120A in the second electrical setting, via phase line 122A, and may determine the actual electrical status for first electrical loop 120A. In the non-limiting example, the electrical status electrical switch 128B may break the electrical connection in first electrical loop 120A. As a result, the actual electrical status for first electrical loop 120A in the second electrical setting may be "no voltage detected" (see, Table 1). Once the actual electrical status is determined, computing device 112 may detect if a fault exists in first electrical loop 120A in the second electrical setting by determining if the actual electrical status differs from the expected electrical status based on the known. In the non-limiting example, computing device(s) 112 of power system 100 (see, FIG. 1) may not detect a fault for first electrical loop 120A in the second electrical setting as a result of the actual electrical status matching the expected electrical status for first electrical loop 120A in the second electrical setting (e.g., "No Voltage Detected").

As shown in Table 1, computing device(s) 112 may continue to repeat the testing process through all of the possible electrical settings for first electrical loop 120A. In the non-limiting example where first electrical loop 120A includes two distinct electrical switches 128A, 128B, four distinct electrical settings may be tested (see, Table 1). In the instance where no faults are detected, computing device(s) 112 may determine that first electrical loop 120A is wired properly, includes the desired number/position status/physical location for all included electrical switches, and/or will operate as desired/intended. In comparing FIGS. 3A and 3B, and based on the results of the testing process performed on first electrical loop 120A as shown in Table 1, it is understood or confirmed that first electrical loop 120A of control circuit 110 matches the desired, schematic model of first electrical loop 220A of control circuit 210 included in computing device(s) 112.

Once first electrical loop 120A is tested and/or free of faults or abnormalities (see, FIGS. 4A and 5A), computing device(s) 112 may test distinct electrical loops 120 in a similar manner. For example, after first electrical loop 120A of control circuit 110 is tested, as discussed herein with respect to Table 1, computing device(s) 112 may go on to test second electrical loop 120B (see, FIG. 2). Similar to first electrical loop 120A, computing device(s) 112 may test second electrical loop 120B by configuring second electrical loop 120B in all possible or a plurality of electrical settings by adjusting the operational characteristic of at least one of electrical switches 128C, 128D, 128E, and 128F of second electrical loop 120B. Next, a voltage may be supplied across second electrical loop 120B in the plurality of electrical settings via phase line 122B, and computing device(s) 112 may determine the actual electrical status of second electrical loop 120B in each of the plurality of electrical settings based on whether relay 126B of return line 124B (see, FIG. 2) of second electrical loop 120B detects the supplied voltage. Finally, a fault may be detected in second electrical loop in at least one of the plurality of electrical settings in response to the determined actual electrical status of second electrical loop 120B differing from expected electrical status of second electrical loop 120B in each of the plurality of electrical settings. Similar to first electrical loop 120A, the expected electrical status of the second electrical loop 120B may be determined and/or known based on the predetermined model of second electrical loop 120B for control circuit 110, as stored or included within computing device(s) 112.

Figure 4A:
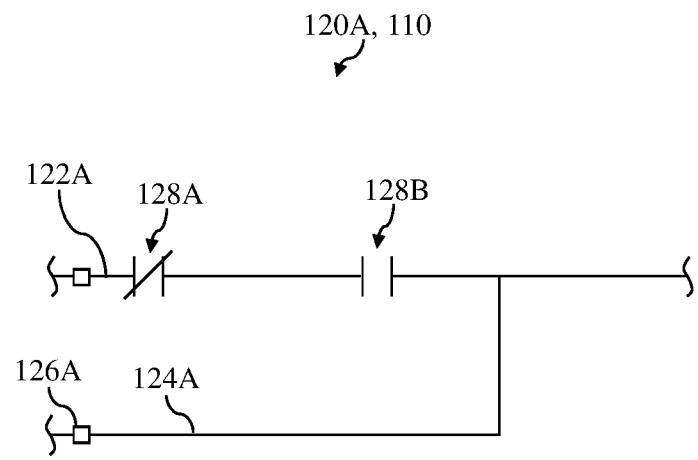
FIG. 4A shows a schematic depiction of an actual first electrical loop of the portion of control circuit shown in FIG. 2, according to additional embodiments of the disclosure.
Figure 4B:
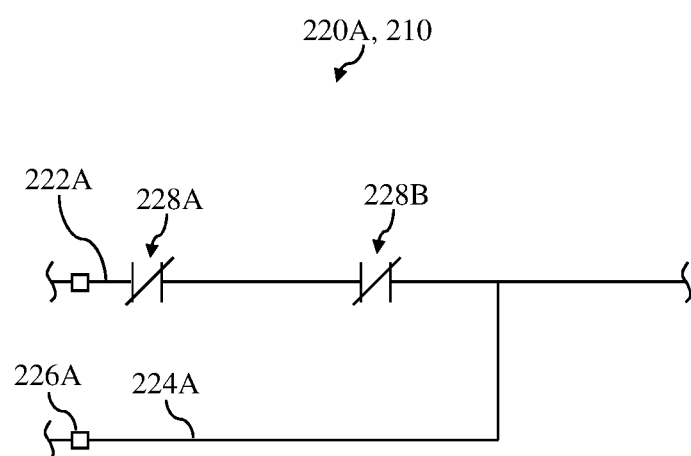
FIG. 4B shows a predetermined schematic model of the first electrical loop of the portion of control circuit shown in FIG. 2, according to another embodiment of the disclosure.
Figure 5A:
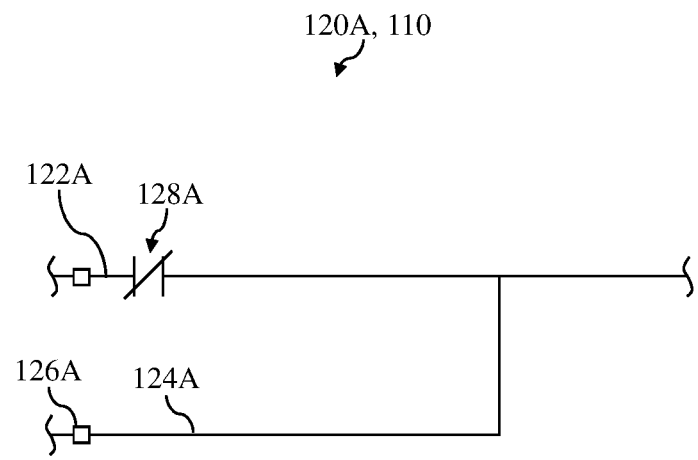
FIG. 5A shows a schematic depiction of an actual first electrical loop of the portion of control circuit shown in FIG. 2, according to additional embodiments of the disclosure.
Figure 5B:
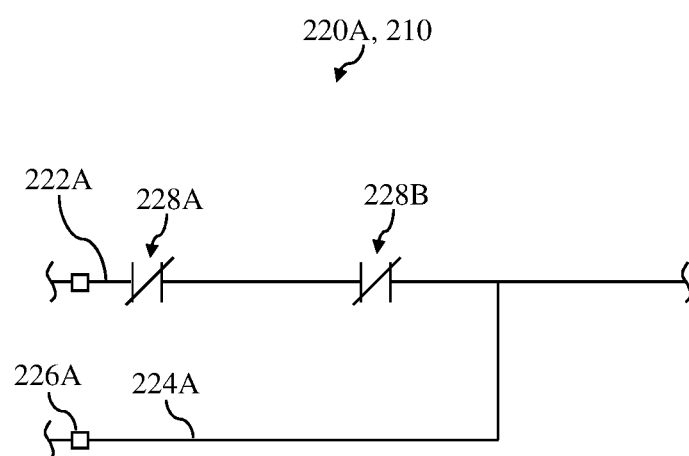
FIG. 5B shows a predetermined schematic model of the first electrical loop of the portion of control circuit shown in FIG. 2, according to another embodiment of the disclosure.

Turning to FIGS. 4A-5B, additional, non-limiting examples of first electrical loop 120A of the plurality of electrical loops in control circuit 110 are shown. As discussed herein, first electrical loop 120A of control circuit 110 as shown in FIGS. 4A and 5A may each be distinct from the desired configuration of first electrical loop 220A as shown in FIGS. 4B and 5B, as identified by computing device(s) 112. It is understood that similarly numbered and/or named components may function in a substantially similar fashion. Redundant explanation of these components has been omitted for clarity.

Turning back to FIG. 4A, another non-limiting example of first electrical loop 120A is shown. As similarly discussed herein, first electrical loop 120A may include first electrical switch 128A and second electrical switch 128B, formed in series with one another. However, distinct from the non-limiting example shown in FIG. 3A, and distinct from the desired configuration of first electrical loop 220A shown in FIG. 4B, second electrical switch 128B may include a distinct and/or undesirable position status. For example, second electrical switch 128B may include a position status that is "normally open," as oppose to the desired or specified, "normally closed" position status (compare, FIG. 4A with FIG. 4B—228B). As a result, and as discussed herein, when performing the testing process on first electrical loop 120A shown in FIG. 4A, computing device(s) 112 may detect at least one fault in first electrical loop 120A.

Table 2 depicts the results of performing a test process on first electrical loop 120A (e.g., FIG. 4A) of control circuit 110 based on identified and/or know information from electrical loop 220A (see, FIG. 4B). Computing device(s) 112 (see, FIG. 1) may perform the testing process on first electrical loop 120A shown in FIG. 4A in a similar manner as discussed herein with respect to FIGS. 3A and 3B. As such, redundant explanation of the test may be omitted for brevity. However, in preforming the testing process, computing device(s) 112 may detect two faults in first electrical loop 120A. That is, the non-limiting example of first electrical loop 120A may result in the detection of two faults, as a result of the actual electrical status differing from the expected electrical status. As shown in Table 2, computing device(s) 112 may detect two faults where the actual electrical status differs from the expected electrical status—in the first electrical setting and the second electrical setting. As discussed herein, second electrical switch 128B may include a normally open position status. As a result, in the first electrical setting when the operational characteristic of second electrical switch 128B is adjusted to the open position, second electrical switch 128B may break or disrupt the connection. Additionally, in the second electrical setting when the operational characteristic of second electrical switch 128B is adjusted to the closed position, second electrical switch 128B may maintain and/or create the electrical connection within first electrical loop 120A. As such, no voltage may actually be detected in the first electrical setting when a voltage is expected to be detected, while a voltage may actually be detected in the second electrical setting when a voltage is not expected to be detected.

TABLE 2

FIRST ELECTRICAL LOOP 120A

| Electrical Setting | Switch 128A | Switch 128B | Electrical Status (Actual) | Electrical Status (Expected) | Fault |
|---|---|---|---|---|---|
| 1 | Open | Open | No Voltage Detected | Voltage Detected | Yes |
| 2 | Open | Close | Voltage Detected | No Voltage Detected | Yes |
| 3 | Close | Open | No Voltage Detected | No Voltage Detected | No |
| 4 | Close | Close | No Voltage Detected | No Voltage Detected | No |

In response to detecting a fault(s) in first electrical loop 120A, computing device 112 may perform additional processes while testing first electrical loop 120A. For example, computing device(s) 112 may also identify an abnormality in at least one electrical switch 128A, 128B in first electrical loop 120A based on at least one of the detected faults. That is, based on the predetermined information of control circuit 210 stored therein, as well as the known configuration of each electrical setting that includes a fault (e.g., the adjusted operation characteristics of each electrical switch 128A, 128B), computing device(s) 112 may determine or identify an abnormality in a specific electrical switch 128A, 128B in first electrical loop 120A that may require correction. In the non-limiting example shown in FIGS. 4A and 4B, and with reference to the results shown in Table 2, computing device(s) 112 may determine that second electrical switch 128B in the non-limiting example of first electrical loop 120A may include an abnormality. Additionally, and based on the detected faults and/or the actual electrical statuses of first electrical loop 120A, computing device(s) 120A may determine and/or identify specifics relating to the abnormality of second electrical switch 128B. For example, because a fault was detected in both the first and second electrical setting, computing device(s) 112 of power system 100 (see, FIG. 1) may determine and/or identify that second electrical switch 128A of first electrical loop 120A for control circuit 110 is configured or formed a normally open electrical switch, and not the desired, normally closed electrical switch. After identifying the specific abnormality, computing device(s) 112 may provide an indication and/or output to a user or operator of power system 100 (see, FIG. 1) to highlight the abnormality and/or provide a solution for correcting the abnormality discovered or identified in first electrical loop 120A.

Once the abnormality in first electrical loop 120A is identified, a user or operator may have the instructions and opportunity to correct or fix first electrical loop 120A. Using the information provided by computing device(s) 112 relating to abnormality identified in first electrical loop 120A, a user or operator of power system 100 may fix or correct actual or physical control circuit 110 of power system 100. Once the identified abnormality in electrical switch(es) 128A, 128B in first electrical loop 120A is corrected, computing device(s) 112 may rerun or retest first electrical loop 120A to determine if additional faults and/or abnormalities are present. That is, in response to correcting the at least one electrical switch 128B including the identified abnormality, computing device(s) 112 may test first electrical loop 120A by configuring first electrical loop 120A in all possible or the plurality of electrical settings. Next, a voltage may be supplied across first electrical loop 120A in the plurality of electrical settings via phase line 122A, and computing device(s) 112 may determine the actual electrical status of first electrical loop 120A in each of the plurality of electrical settings. Finally, and as desired, no fault may be detected in first electrical loop 120A in response to the determined actual electrical status of second electrical loop 120B matching and/or being the same as the expected electrical status of first electrical loop 120B in each of the plurality of electrical settings.

FIG. 5A shows another non-limiting example of first electrical loop 120A. Distinct from the non-limiting example shown in FIG. 3A, and distinct from the desired configuration of first electrical loop 220A shown in FIG. 5B, in FIG. 5A, first electrical loop 120A may not include second electrical switch 128B. That is, first electrical loop 120A of control circuit 110 in power system 100 (see, FIG. 1) may incorrectly only include first electrical switch 128A operably coupled phase line 122A and return line 124A. As a result, and as shown in Table 3, when computing device 112 performs the testing process on first electrical loop 120A depicted in FIG. 5A, a fault in first electrical loop 120A may be detected. Specifically, a fault may be detected in the second electrical setting of first electrical loop 120A when performing the testing process.

TABLE 3

FIRST ELECTRICAL LOOP 120A

| Electrical Setting | Switch 128A | Switch 128B | Electrical Status (Actual) | Electrical Status (Expected) | Fault |
|---|---|---|---|---|---|
| 1 | Open | Open | Voltage Detected | Voltage Detected | No |
| 2 | Open | Close | Voltage Detected | No Voltage Detected | Yes |
| 3 | Close | Open | No Voltage Detected | No Voltage Detected | No |
| 4 | Close | Close | No Voltage Detected | No Voltage Detected | No |

As similarly discussed herein with respect to FIG. 4A and Table 2, in response to detecting a fault(s) in first electrical loop 120A, computing device(s) 112 may also identify an abnormality in at least one electrical switch 128A, 128B in first electrical loop 120A based on at least one of the detected faults. In the non-limiting example shown in FIGS. 5A and 5B, and with reference to the results shown in Table 3, computing device(s) 112 may detect an abnormality in first electrical loop 120A based on second electrical switch 128B. Additionally, and based on the detected faults and/or the actual electrical statuses of first electrical loop 120A, computing device(s) 120A may determine and/or identify specifics relating to the abnormality of second electrical switch 128B. For example, because a fault was detected in only the second electrical setting, computing device(s) 112 of power system 100 (see, FIG. 1) may determine and/or identify that second electrical switch 128A is not present in first electrical loop 120A for control circuit 110. After identifying the specific abnormality, computing device(s) 112 may provide an indication and/or output to a user or operator of power system 100 (see, FIG. 1) to highlight the abnormality and/or provide a solution for correcting the abnormality discovered or identified in first electrical loop 120A.

Although discussed herein as testing each electrical loop 120A, 120B, 120C of control circuit 110 individually, it is also understood that that the plurality of electrical loops 120A, 120B, 120C forming control circuit 110 may also be combined and tested, as discussed herein. That is, once each of the plurality of electrical loops 120A, 120B, 120C of control circuit 110 are tested individually, tested, individual electrical loops 120A, 120B, 120C may be combined and tested in a similar manner as discussed herein with respect to FIGS. 3-5. Returning to FIG. 2, first electrical loop 120A, second electrical loop 120B, and third electrical loop 120C may be electrically coupled and/or in communication with one another and distinct portions of control circuit 110 (not shown) via an electrical bridge portion (not explicitly shown). In a non-limiting example, first electrical loop 120A and second electrical loop 120B may be combined or joined, and may undergo the testing process. Specifically, first electrical loop 120A and second electrical loop 120B may be configured in a plurality of electrical settings, and may have a single voltage provided through each of the electrical loops 120A, 120B (e.g., in series) in each of the plurality of electrical settings to detect any faults and/or identify any abnormalities in the either or both electrical loops 120A, 120B. Additionally, or alternatively, testing the combined electrical loops 120A, 120B, 120C of control circuit 110 may verify that faults detected and/or abnormalities identified after testing the individual electrical loops 120A, 120B, 120C were corrected, fixed, and/or mitigated properly prior to performing the testing process on the combined electrical loops 120A, 120B, 120C.

Figure 6:
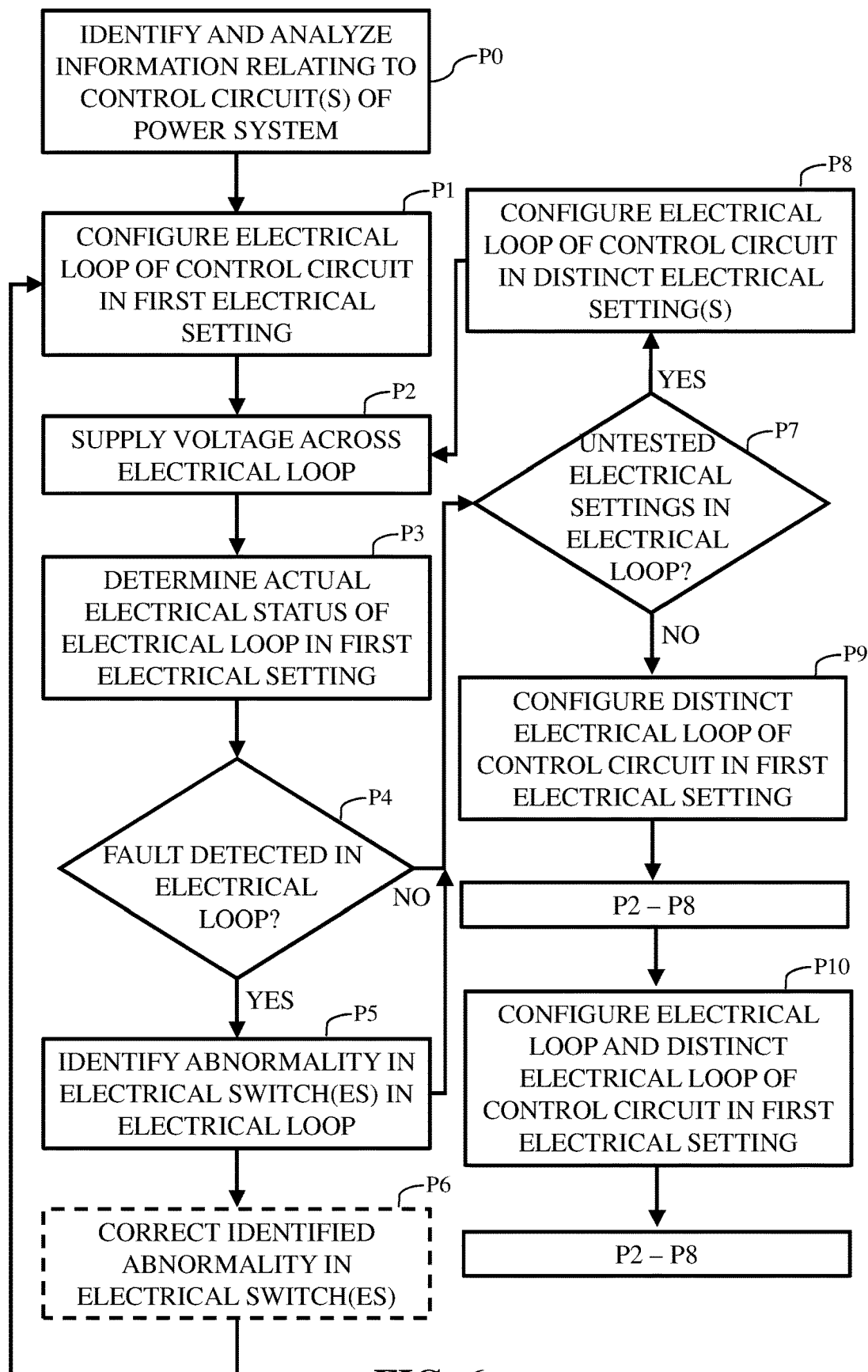
FIG. 6 shows a flow chart of an example process for testing a plurality of electrical loops of a control circuit in a power system, according to embodiments of the disclosure.

FIG. 6 shows a flow diagram illustrating non-limiting example processes of testing each of a plurality of electrical loops of control circuits included in an electrical power system. These processes may be performed, e.g., by at least one computing device 112 including control system 118/testing system 119 (see, FIGS. 1 and 7), as described herein. In other cases, these processes may be performed according to a computer-implemented method of controlling power system 100. In still other embodiments, these processes may be performed by executing computer program code on computing device(s) 112, causing computing device(s) 112, and specifically control system 118/testing system 119, to control operation of power system 100.

In process P0, information relating to a control circuit(s) of a power system may be identified and/or analyzed. The information relating to the control circuit(s) may include the electrical configuration or schematic of the power system including the control circuit(s), and specific information relating to each control circuit included in the power system, including, but not limiting to, the electrical configuration and/or electrical loops that may form each control circuit of the power system. Additionally, the identifying and/or analyzing the information relating to the control circuit(s) of power system may also include identifying, isolating, and/or "dividing" each control circuit(s) into a plurality of electrical loops for the purposing of testing, as discussed herein. The identified information may further relate to known and/or predetermined data or information that is specific to a desired configuration of each electrical loop of the control circuit(s). For example, identifying information in process P0 may include, identifying a number of electrical switches included in each electrical loop, identifying a position status of the at least one electrical switches included within each electrical loop, and/or identifying a physical location of the electrical switch(es) within each electrical loop.

In process P1, one electrical loop (e.g., a first electrical loop) of the control circuit may be configured in a first electrical setting. The electrical loop of the control circuit may be configured in the first electrical setting by adjusting an operational characteristic of at least one electrical switch included in the electrical loop. Adjusting the operational characteristic of the electrical switch(es) included in the electrical loop may include changing an operational position of at least one of the electrical switches (e.g., first electrical switch, second electrical switch, and so on) to one of an open position or a closed position.

In process P2, a voltage may be supplied across the electrical loop of the control circuit. More specifically, a voltage may be supplied across a phase line of electrical loop of the control circuit to the electrically switch(es) operably coupled between the phase line and a return line.

In process P3, an actual electrical status of the electrical loop may be determined. The actual electrical status of the electrical loop in the first electrical setting may be determined by a relay included in the return line. That is, the actual electrical status of the electrical loop may be determined based on whether the relay of the return line detects the supplied voltage supplied in process P2. The relay of the return line may detect the voltage when the electrical switches of the electrical loop connect and/or form an electrically conductive/closed loop in the electrical loop of the control circuit.

In process P4, it may be determined if a fault is detected in the electrical loop. More specifically, a fault may be detected in the electrical loop in response to determined actual electrical status of the electrical loop in the first electrical setting differing from an expected electrical status of the electrical loop in the first electrical setting. The actual electrical status of the electrical loop may be determined in process P3. Additionally, the expected electrical status of the electrical loop in the first electrical setting may be determined using the identified and analyzed information in process P0 and/or may be known based on the identified and analyzed information in process P0.

In response to detecting a fault in the electrical loop (e.g., "YES" at process P4), an abnormality in the electrical switch(es) in the electrical loop may be identified. If a fault is detected, or alternatively a plurality of faults are detected in the electrical loop, an abnormality in the electrical switch(es) in the electrical loop may be identified. That is, the abnormality in the electrical switch(es) may be identified based on the detected fault in the electrical loop in the first electrical setting and/or a detected fault in the electrical loop in a distinct electrical setting, as discussed herein. Identifying the abnormality in the electrical switch(es) may further include identifying the type of abnormality in the electrical switch(es) based on the fault or faults detected. For example, the abnormality identified in process P5 may include identifying or determining that at least one the electrical switches in the electrical loop includes the wrong position status (e.g., normally closed, normally open) or alternatively is not present at all or missing within the electrical loop.

In process P6 (shown in phantom as an optional process step), the identified abnormality in the electrical switch(es) in the electrical loop may be corrected. That is, in addition to identifying the abnormality, a specific solution and/or plan for fixing or correcting the abnormality in the electrical switch(es) in the electrical loop may be provided to allow an operator or user of the power system to correct the abnormality. Subsequent to correcting the identified abnormality in the electrical switch(es), processes P1-P4 may be performed on the electrical loop again to ensure the abnormality was fixed and/or no fault is subsequently detected (e.g., process P4).

Alternatively, after performing process P5, the identified abnormality in the electrical switch(es) may not be immediately corrected (e.g., process P6). Rather, the processes discussed herein may continue to be performed accordingly. For example, and as discussed herein, once the abnormality in the electrical switch(es) in the electrical loop is identified (e.g., process P5), the processes for testing the electrical loop may continue or proceed to process P7, as discussed herein.

In response to not detecting a fault in the electrical loop (e.g., "NO" at process P4), it may be determined if any distinct electrical settings of the electrical loop have not been tested yet in process P7. That is, and dependent upon the information identified and/or analyzed in process P0 (e.g., the number of electrical switches included within the electrical loop), the electrical loop may including a plurality of distinct electrical settings that must be tested using processes P1-P5. If there are untested electrical settings for the electrical loop (e.g., "YES" at process P7), than the method may proceed to process P8. If all electrical settings for the electrical loop have been tested (e.g., "NO" at process P7), than the method may proceed to process P9.

In process P8, and where it is determined that there are untested electrical settings for the electrical loop, the electrical loop of the control circuit may be configured in an electrical setting that is distinct from the first electrical setting. The electrical loop of the control circuit may be configured in the distinct electrical setting by adjusting an operational characteristic of at least one electrical switch included in the electrical loop, such that at least one of the electrical switch(es) includes a distinct operational characteristic when compared to the adjusted operational characteristic in the first electrical setting. Once the electrical loop is configured in the distinct electrical setting, the electrical loop may undergo processes P2-P7 (when applicable) again to test the electrical loop, and more specifically determine if a fault is detected in the electrical loop in the distinct electrical setting.

After it is determined that all electrical settings for the electrical loop have been tested (e.g., "NO" at process P7), a distinct electrical loop (e.g., second electrical loop) of the control circuit, which is distinct from the electrical loop (e.g., first electrical loop), may be configured in a first electrical setting in process P9. That is, once all of the plurality of electrical settings for the electrical loop have been tested via process P2-P8, and no faults have been detected (e.g., "NO" at process P4), than a distinct electrical loop of the control circuit may be identified and configured in a first electrical setting of a plurality of electrical settings for the distinct electrical loop. Once configured, the distinct electrical loop may undergo similar processes as the electrical loop. That is, the distinct electrical loop configured in the first electrical setting may undergo processes identical to P2-P8 until no faults are detected in the distinct electrical loop.

After it is determined that all electrical settings for the distinct electrical loop have been tested (e.g., "NO" at process P7 subsequent performing process P9), the electrical loop (e.g., first electrical loop) and the distinct electrical loop (e.g., second electrical loop) of the control circuit may undergo the testing process together. More specifically, the electrical loop and the distinct electrical loop may be identified as a combined electrical loop, and may be subsequently tested as the combined electrical loop of the control circuit. For example, in process P10, the combined electrical loop including the electrical loop and the distinct electrical loop may be configured in a first electrical setting. That is, once all of the plurality of electrical settings for the electrical loop and the distinct electrical loop have been tested as divided or individual electrical loops of the control circuit via process P2-P8, then the combined electrical loop of the control circuit may be tested. The combined electrical loop of the control circuit formed by the electrical loop and the distinct electrical loop may be identified and configured in a first electrical setting of a plurality of electrical settings for the distinct electrical loop. Once configured, the combined electrical loop may undergo similar processes as the electrical loop and/or the distinct electrical loop (e.g., processes identical to P2-P8 until no faults are detected in the combined electrical loop).

The processes P1-P10 may be performed on each control circuit until all electrical loops forming the control circuit have been tested. More specifically, processes P1-P10 may be performed until all electrical loops are tested both individual and as combined electrical loops until all faults have been detected (e.g., process P4), all abnormalities have been identified (e.g., process P5), and/or no faults are detected (e.g., process P4) in the various electrical loops forming the control circuit. Once all individual electrical loops and combined electrical loops have been tested, the process may end for the identified and tested control circuit. Where the electrical power system being tested includes a plurality of control circuits, processes P0-P10 may be performed on distinct control circuits including distinct electrical loops from those discussed herein. The testing processes (e.g., P0-P10) discussed herein with respect to FIG. 6 may allow operators of electrical power systems to test entire systems using only a control system of the electrical power system, and/or allow operators to test entire electrical power systems in reduced amount of time (e.g., less than an hour).

It is to be understood that in the flow diagrams shown and described herein, other processes or operations, while not being shown, may be performed. The order of processes may also be rearranged according to various embodiments. For example, although shown as being performed in succession, processes P0 and P1 may be performed simultaneously. Additionally, intermediate processes may be performed between one or more described processes. For example, and as discussed herein, process P6 may be performed after performing processes P1-P5 for distinct electrical settings for the electrical loop, or alternatively simultaneous to or after performing process P7. The flow of processes shown and described herein is not to be construed as being limited to the various embodiments.

Figure 7:
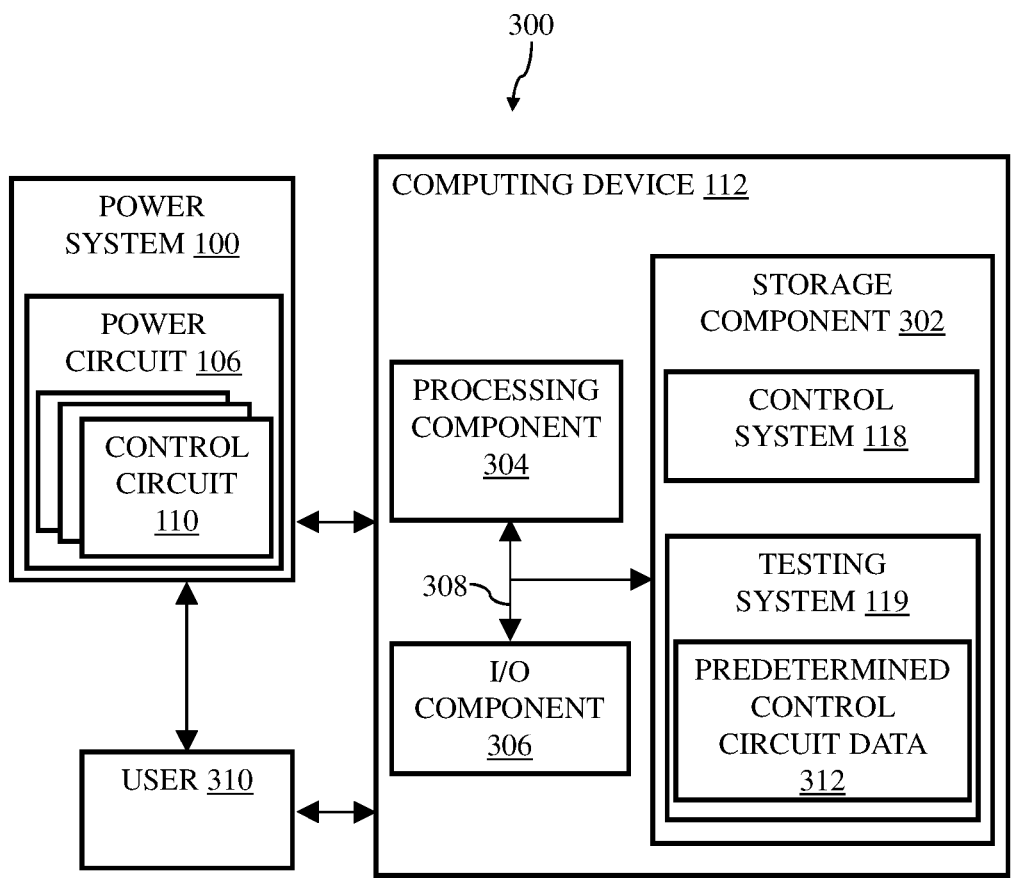
FIG. 7 shows an environment including at least one computing device for testing a plurality of electrical loops of a control circuit in a power system as shown in FIGS. 1-5B, according to embodiments of the disclosure.

FIG. 7 shows an illustrative environment 300. To this extent, environment 300 includes at least one computing device(s) 112 that can perform the various process steps described herein for testing control circuits 110 included within power system 100. In particular, computer infrastructure 112 is shown including a control system 118 and testing system 119, which enable computing device 112 to control operation of power system 100, as well as test control circuits 110 of power system 100 by performing one or more of the process steps of the disclosure.

Computing device 112 is shown including a storage component 302, a processing component 304, an input/output (I/O) component 306, and a bus 308. Further, computing device 112 is shown in communication with power system 100 and a user 310. As is known in the art, in general, processing component 304 executes computer program code, such as control system 118 or testing system 119, that is stored in storage component 302 or an external storage component (not shown). While executing computer program code, processing component 304 may read and/or write data, such as control system 118 and/or predetermined control circuit data 312 of testing system 119, to/from storage component 302 and/or I/O component 306. Bus 308 provides a communications link between each of the components in computing device 112. I/O component 306 may comprise any device that enables user 310 to interact with computing device 112 or any device that enables computing device 112 to communicate with one or more other computing devices. Input/output devices (including but not limited to keyboards, displays, pointing devices, etc.) may be coupled to the system either directly or through intervening I/O controllers.

In any event, computing device 112 may comprise any general purpose computing article of manufacture capable of executing computer program code installed by a user 310 (e.g., a personal computer, server, handheld device, etc.). However, it is understood that computing device 112 and control system 118/testing system 119 are only representative of various possible equivalent computing devices that may perform the various process steps of the disclosure. To this extent, in other embodiments, computing device 112 may comprise any specific purpose computing article of manufacture comprising hardware and/or computer program code for performing specific functions, any computing article of manufacture that comprises a combination of specific purpose and general purpose hardware/software, or the like. In each case, the program code and hardware may be created using standard programming and engineering techniques, respectively.

Similarly, computing device 112 is only illustrative of various types of computer infrastructures for implementing the disclosure. For example, in one embodiment, computing device 112 may include two or more computing devices (e.g., a server cluster) that communicate over any type of wired and/or wireless communications link, such as a network, a shared memory, or the like, to perform the various process steps of the disclosure. When the communications link comprises a network, the network may comprise any combination of one or more types of networks (e.g., the Internet, a wide area network, a local area network, a virtual private network, etc.). Network adapters may also be coupled to the system to enable the data processing system to become coupled to other data processing systems or remote printers or storage devices through intervening private or public networks. Modems, cable modem and Ethernet cards are just a few of the currently available types of network adapters. Regardless, communications between the computing devices may utilize any combination of various types of transmission techniques.

As previously mentioned and discussed herein, control system 118 enables computing device 112 to control operation of power system 100 and testing system 119 enables computing device 112 to perform testing processes on control circuits 110 of power system 100. To this extent, testing system 119 is shown including predetermined control circuit data 312 that may be utilized in the testing process. Operation of this data is discussed further herein. However, it is to be understood that some of the data shown in FIG. 7 may be implemented independently, combined, and/or stored in memory for one or more separate computing devices that are included in computing device 112. Further, it is to be understood that some of the data and/or functionality may not be implemented, or additional data and/or functionality may be included as part of environment 300.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, may be implemented by special purpose hardware-based systems that perform the specified functions or acts, or combinations of special purpose hardware and computer instructions.

As discussed herein, various systems and components are described as "obtaining" data. It is understood that the corresponding data can be obtained using any solution. For example, the corresponding system/component can generate and/or be used to generate the data, retrieve the data from one or more data stores (e.g., a database), receive the data from another system/component, and/or the like. When the data is not generated by the particular system/component, it is understood that another system/component can be implemented apart from the system/component shown, which generates the data and provides it to the system/component and/or stores the data for access by the system/component.

As will be appreciated by one skilled in the art, the present disclosure may be embodied as a system, method or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present disclosure is described herein with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Technical effects of the disclosure include, e.g., providing a systems, computer program products, and methods for quickly and effectively testing control circuits included within power circuits for large systems. The system, computer program product, and methods may also provide output regarding specific, detected abnormalities in the control circuits and details relating to how to correct or fix these detected abnormalities.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims herein are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A power system, comprising:
    at least one computing device in communication with a control circuit including a plurality of electrical loops, each electrical loop of the plurality of electrical loops including:
        a phase line,
        a return line operably connected to the phase line, the return line including a relay, and
        at least one electrical switch operably coupled between the phase line and the return line,
    wherein the at least one computing device is configured to test each of the plurality of electrical loops of the control circuit by performing processes including:
        configuring a first electrical loop of the plurality of electrical loops in a first electrical setting by adjusting an operational characteristic of the at least one electrical switch;
        supplying a voltage across the first electrical loop in the first electrical setting via the phase line;
        determining an actual electrical status of the first electrical loop in the first electrical setting based on whether the relay of the return line detects the supplied voltage; and
        detecting a fault in the first electrical loop in response to the determined actual electrical status of the first electrical loop in the first electrical setting differing from an expected electrical status of the first electrical loop in the first electrical setting.

2. The power system of claim 1, wherein the processes performed by the at least one computing device to test each of the plurality of electrical loops of the control circuit further include:
    configuring the first electrical loop in a second electrical setting by adjusting an operational characteristic of the at least one electrical switch, the second electrical setting distinct from the first electrical setting;
    supplying the voltage across the first electrical loop in the second electrical setting via the phase line;
    determining the actual electrical status of the first electrical loop in the second electrical setting based on whether the relay of the return line detects the supplied voltage; and
    detecting a fault in the first electrical loop in response to the determined actual electrical status of the first electrical loop in the second electrical setting differing from an expected electrical status of the first electrical loop in the second electrical setting.

3. The power system of claim 2, wherein the processes performed by the at least one computing device to test each of the plurality of electrical loops of the control circuit further include:
    identifying an abnormality in the at least one electrical switch based on at least one of the detected fault in the first electrical loop in the first electrical setting, or the detected fault in the first electrical loop in the second electrical setting.

4. The power system of claim 3, wherein the processes performed by the at least one computing device to test each of the plurality of electrical loops of the control circuit further include:
    in response to correcting the at least one electrical switch including the identified abnormality:
        configuring the first electrical loop including the corrected at least one electrical switch in the first electrical setting by adjusting the operational characteristic of the at least one electrical switch;
        supplying the voltage across the first electrical loop in the first electrical setting via the phase line;
        determining the actual electrical status of the first electrical loop in the first electrical setting based on whether the relay of the return line detects the supplied voltage; and
        detecting no fault in the first electrical loop in response to the determined actual electrical status of the first electrical loop in the first electrical setting being the same as the expected electrical status of the first electrical loop in the first electrical setting.

5. The power system of claim 4, wherein the processes performed by the at least one computing device to test each of the plurality of electrical loops of the control circuit further include:
    configuring a second electrical loop in a plurality of distinct electrical settings by adjusting an operational characteristic of the at least one electrical switch of the second electrical loop;
    supplying a voltage across the second electrical loop in each of the plurality of electrical settings via the phase line of the second electrical loop;
    determining an actual electrical status of the second electrical loop in each of the plurality of electrical settings based on whether the relay of the return line of the second electrical loop detects the supplied voltage; and detecting a fault in the second electrical loop in response to the determined actual electrical status of the second electrical loop in each of the plurality of electrical settings differing from an expected electrical status of the second electrical loop in each of the plurality of electrical settings.

6. The power system of claim 1, wherein the at least one computing device is configured to adjust the operational characteristic of the at least one electrical switch of the first electrical loop by performing processes including at least one of:

changing an operational position of a first electrical switch of the at least one electrical switch to an open position, changing the operational position of the first electrical switch of the at least one electrical switch to a closed position, changing an operational position of a second electrical switch of the at least one electrical switch to an open position, the second electrical switch distinct from the first electrical switch, or changing the operational position of the second electrical switch of the at least one electrical switch to a closed position.

7. The power system of claim 1, wherein the processes performed by the at least one computing device to test each of the plurality of electrical loops of the control circuit further include:

prior to the configuring of the first electrical loop in the first electrical setting:
identifying a number of electrical switches included in the first electrical loop;
identifying a position status of electrical switches included in the first electrical loop; and
identifying a physical location of electrical switches within the first electrical loop.

8. The power system of claim 1, further comprising:
at least one power source;
at least one electrical load operably coupled to the at least one power source; and
a power circuit electrically coupling and positioned between the at least one power source and the at least one electrical load, the power circuit including:
at least one electrical hardware component positioned in the power circuit to selectively, electrically couple the at least one power source and the at least one electrical load,
wherein the at least one electrical hardware component includes the control circuit including the plurality of electrical loops.

9. A method of testing a plurality of electrical loops included in a control circuit, the method comprising:
configuring a first electrical loop of the plurality of electrical loops in a first electrical setting by adjusting an operational characteristic of at least one electrical switch of the first electrical loop,
wherein each electrical loop of the plurality of electrical loops includes:
a phase line,
a return line operably connected to the phase line, the return line including a relay, and
the at least one electrical switch operably coupled between the phase line and the return line;

supplying a voltage across the first electrical loop in the first electrical setting via the phase line;
determining an actual electrical status of the first electrical loop in the first electrical setting based on whether the relay of the return line detects the supplied voltage; and
detecting a fault in the first electrical loop in response to the determined actual electrical status of the first electrical loop in the first electrical setting differing from an expected electrical status of the first electrical loop in the first electrical setting.

10. The method of claim 9, further comprising:
configuring the first electrical loop in a second electrical setting by adjusting an operational characteristic of the at least one electrical switch, the second electrical setting distinct from the first electrical setting;
supplying the voltage across the first electrical loop in the second electrical setting via the phase line;
determining the actual electrical status of the first electrical loop in the second electrical setting based on whether the relay of the return line detects the supplied voltage; and
detecting a fault in the first electrical loop in response to the determined actual electrical status of the first electrical loop in the second electrical setting differing from an expected electrical status of the first electrical loop in the second electrical setting.

11. The method of claim 10, further comprising:
identifying an abnormality in the at least one electrical switch based on at least one of the detected fault in the first electrical loop in the first electrical setting, or the detected fault in the first electrical loop in the second electrical setting.

12. The method of claim 11, further comprising:
in response correcting the at least one electrical switch including the identified abnormality:
configuring the first electrical loop including the corrected at least one electrical switch in the first electrical setting by adjusting the operational characteristic of the at least one electrical switch;
supplying the voltage across the first electrical loop in the first electrical setting via the phase line;
determining the actual electrical status of the first electrical loop in the first electrical setting based on whether the relay of the return line detects the supplied voltage; and
detecting no fault in the first electrical loop in response to the determined actual electrical status of the first electrical loop in the first electrical setting being the same as the expected electrical status of the first electrical loop in the first electrical setting.

13. The method of claim 12, further comprising:
configuring a second electrical loop in a plurality of distinct electrical settings by adjusting an operational characteristic of the at least one electrical switch of the second electrical loop;
supplying a voltage across the second electrical loop in each of the plurality of electrical settings via the phase line of the second electrical loop;
determining an actual electrical status of the second electrical loop in each of the plurality of electrical settings based on whether the relay of the return line of the second electrical loop detects the supplied voltage; and
detecting a fault in the second electrical loop in response to the determined actual electrical status of the second electrical loop in each of the plurality of electrical settings differing from an expected electrical status of the second electrical loop in each of the plurality of electrical settings.

14. The method of claim 9, wherein adjusting the operation characteristic of the at least one electrical switch of the first electrical loop further includes at least one of:
   changing an operational position of a first electrical switch of the at least one electrical switch to an open position,
   changing the operational position of the first electrical switch of the at least one electrical switch to a closed position,
   changing an operational position of a second electrical switch of the at least one electrical switch to an open position, the second electrical switch distinct from the first electrical switch, or
   changing the operational position of the second electrical switch of the at least one electrical switch to a closed position.

15. The method of claim 9, further comprising:
   prior to the configuring of the first electrical loop in the first electrical setting:
      identifying a number of electrical switches included in the first electrical loop;
      identifying a position status of electrical switches included in the first electrical loop; and
      identifying a physical location of electrical switches within the first electrical loop.

16. A computer program product comprising program code, which when executed by at least one computing device, causes the at least one computing device to test a plurality of electrical loops of a control circuit, by performing processes including:
   configuring a first electrical loop of the plurality of electrical loops in a first electrical setting by adjusting an operational characteristic of at least one electrical switch of the first electrical loop,
   wherein each electrical loop of the plurality of electrical loops includes:
      a phase line,
      a return line operably connected to the phase line, the return line including a relay, and
      the at least one electrical switch operably coupled between the phase line and the return line;
   supplying a voltage across the first electrical loop in the first electrical setting via the phase line;
   determining an actual electrical status of the first electrical loop in the first electrical setting based on whether the relay of the return line detects the supplied voltage; and
   detecting a fault in the first electrical loop in response to the determined actual electrical status of the first electrical loop in the first electrical setting differing from an expected electrical status of the first electrical loop in the first electrical setting.

17. The computer program product of claim 16, wherein the processes performed by the at least one computing device to test the plurality of electrical loops of the control circuit further include:
   configuring the first electrical loop in a second electrical setting by adjusting an operational characteristic of the at least one electrical switch, the second electrical setting distinct from the first electrical setting;
   supplying the voltage across the first electrical loop in the second electrical setting via the phase line;
   determining the actual electrical status of the first electrical loop in the second electrical setting based on whether the relay of the return line detects the supplied voltage; and
   detecting a fault in the first electrical loop in response to the determined actual electrical status of the first electrical loop in the second electrical setting differing from an expected electrical status of the first electrical loop in the second electrical setting.

18. The computer program product of claim 17, wherein the processes performed by the at least one computing device to test each of the plurality of electrical loops of the control circuit further include:
   identifying an abnormality in the at least one electrical switch based on at least one of the detected fault in the first electrical loop in the first electrical setting, or the detected fault in the first electrical loop in the second electrical setting.

19. The computer program product of claim 17, wherein the processes performed by the at least one computing device to test each of the plurality of electrical loops of the control circuit further include:
   configuring a second electrical loop in a plurality of distinct electrical settings by adjusting an operational characteristic of the at least one electrical switch of the second electrical loop;
   supplying a voltage across the second electrical loop in each of the plurality of electrical settings via the phase line of the second electrical loop;
   determining an actual electrical status of the second electrical loop in each of the plurality of electrical settings based on whether the relay of the return line of the second electrical loop detects the supplied voltage; and
   detecting a fault in the second electrical loop in response to the determined actual electrical status of the second electrical loop in each of the plurality of electrical settings differing from an expected electrical status of the second electrical loop in each of the plurality of electrical settings.

20. The computer program product of claim 16, wherein the processes performed by the at least one computing device to test each of the plurality of electrical loops of the control circuit further include:
   prior to the configuring of the first electrical loop in the first electrical setting:
      identifying a number of electrical switches included in the first electrical loop;
      identifying a position status of electrical switches included in the first electrical loop; and
      identifying a physical location of electrical switches within the first electrical loop.

* * * * *